United States Patent [19]

Takigami et al.

[11] Patent Number: 4,500,907
[45] Date of Patent: Feb. 19, 1985

[54] PRESSURE-APPLIED TYPE SEMICONDUCTOR DEVICE

[75] Inventors: Katsuhiko Takigami, Yokohama; Keiko Tokushuku, Ibaraki, both of Japan

[73] Assignee: Tokyo Shibaura Denki Kabushiki Kaisha, Kawasaki, Japan

[21] Appl. No.: 419,477

[22] Filed: Sep. 17, 1982

[30] Foreign Application Priority Data

Oct. 23, 1981 [JP] Japan .................... 56/169890

[51] Int. Cl.³ .................. H01L 21/603; H01L 23/04; H01L 23/10
[52] U.S. Cl. ........................ 357/79; 357/65; 357/68
[58] Field of Search ................. 357/79, 68, 65

[56] References Cited

U.S. PATENT DOCUMENTS

| | | | |
|---|---|---|---|
| 3,434,017 | 3/1969 | Schlosshauer et al. | 357/68 X |
| 3,452,254 | 6/1969 | Boyer | 357/79 |
| 3,548,267 | 12/1970 | Siddell et al. | 357/79 |
| 3,890,637 | 6/1975 | Yamamoto | 357/79 X |

FOREIGN PATENT DOCUMENTS

| | | |
|---|---|---|
| 3009511 | 9/1980 | Fed. Rep. of Germany . |
| 2169819 | 9/1973 | France . |
| 2254879 | 11/1975 | France . |
| 0006132 | 2/1971 | Japan .................... 357/79 |
| 56-28774 | 7/1981 | Japan . |
| 2810416 | 9/1979 | Netherlands .................... 357/79 |

OTHER PUBLICATIONS

"Chip Packaging Structure with Enhanced Cooling" Berdimaier et al.-IBM Technical Disclosure-vol. 20, No. 5, 10-1977 p. 1772-1773.
"Heat Transfer Apparatus"-Andros et al.-IBM Technical Disclosure-vol. 22, No. 8A, 1-1980 p. 3166.

*Primary Examiner*—Andrew J. James
*Assistant Examiner*—S. V. Clark
*Attorney, Agent, or Firm*—Oblon, Fisher, Spivak, McClelland & Maier

[57] ABSTRACT

A pressure-applied type semiconductor device, in which a metal stamp for urging a semiconductor body is formed with a peripheral annular groove. When pressure is applied, the groove is elastically deformed. Thus, stress concentration in the semiconductor body directly under the edge of the metal stamp can be alleviated.

6 Claims, 15 Drawing Figures

F I G. 8
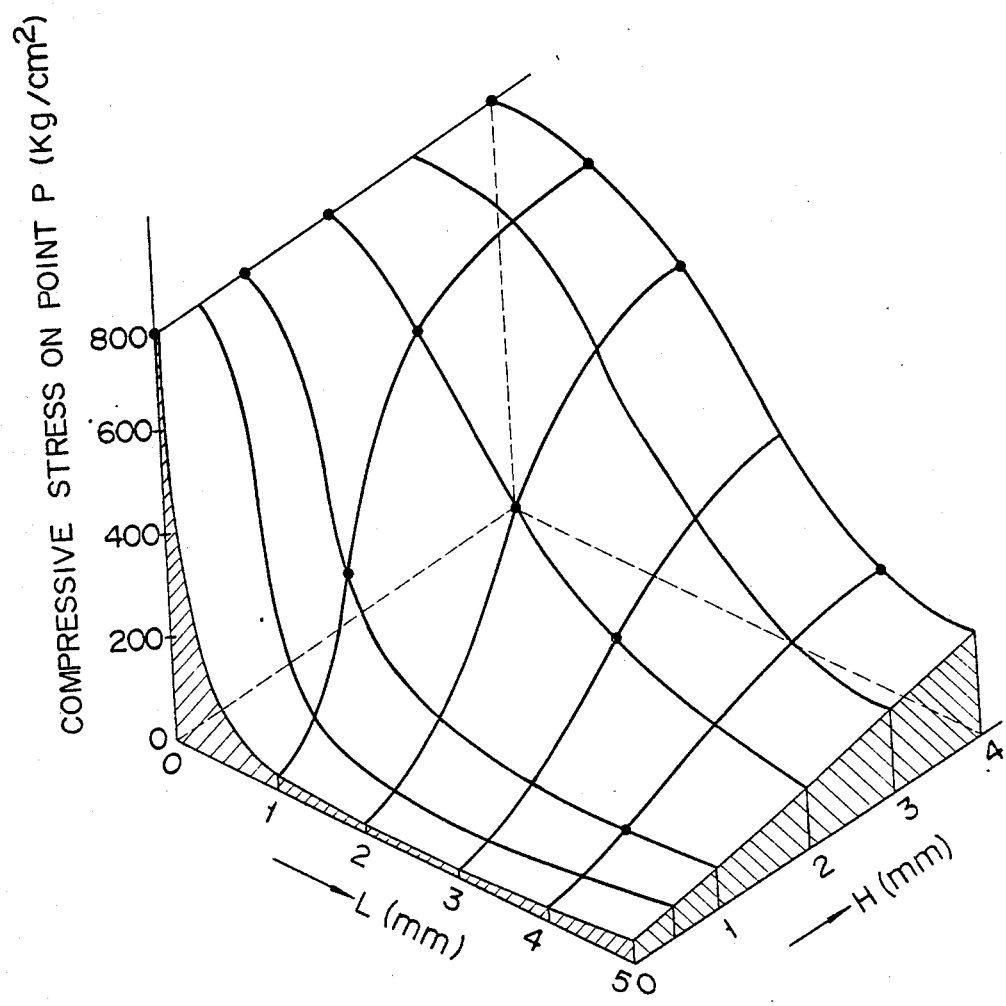

PRESSURE-APPLIED TYPE SEMICONDUCTOR DEVICE

BACKGROUND OF THE INVENTION

This invention relates to a pressure-applied type semiconductor device and, more particularly, to a structure of a pressure-applied type semiconductor device having improved reliability.

Pressure-applied type semiconductor devices, in which semiconductor elements such as transistors, thyristors and gate turn-off thyristors (to be referred to as GTOs hereinafter) are pressed to form an electrical connection, have been well known in the art and generally used for power supplying purposes. FIG. 1 shows a typical construction of a pressure-applied type semiconductor device of this sort. On opposite sides of a semiconductor body 10, cylindrical metal stamps 16 and 18 having high thermal and electrical conductivities are provided via metal plates 12 and 14 having a coefficient of thermal expansion close to that of the body 10. The semiconductor body 10 is pressed by the metal stamps 16 and 18 in the directions indicated by the arrows. The metal plates 12 and 14 are provided between the semiconductor body 10 and the metal stamps 16 and 18 in order to prevent mechanical stress from being applied to the semiconductor body 10 due to the bimetal effect between the semiconductor body 10 and the metal stamps 16 and 18. The bimetal effect results from the difference in the coefficient of thermal expansion between the body and metal stamps. Where the semiconductor body 10 consists of silicon (Si), the metal plates 12 and 14 are usually made of molybdenum (Mo) or tungsten (W). These plates may be called thermal compensation plates. Where the semiconductor body 10 comprises a silicon thyristor, the anode electrode side metal plate 14 is made of a molybdenum plate and is directly bonded to the element by the alloying method. For the metal stamp 18, a cylindrical copper stamp is used and is secured to the metal plate 14 via a solder layer 20. On the cathode electrode side, the metal stamp 16 is likewise secured to the metal plate 12 of molybdenum or the like via a solder layer 22, or a braze layer.

A thyristor or diode that is formed as a power semiconductor body has its cathode electrically integrated as shown in FIGS. 2A and 2B. Thus, even if the press contact is slightly lacking in uniformity, the same performance or behavior could be obtained as when the electric contact is uniform. Lack of uniformity of the press contact, therefore, has presented no substantial problems. FIG. 2B is a sectional view taken along line A-A' in FIG. 2A. In FIGS. 2A and 2B, the element designated by reference numeral 24 is the semiconductor body, 26 is the cathode electrode, 28 the gate electrode, and 30 the anode electrode.

On the other hand, in high power semiconductor devices including transistors or GTOs that have been recently developed, the cathode is divided into a plurality of sections as shown in FIGS. 3A and 3B. These divided electrodes 32 on the cathode region are pressed by a copper stamp via a molybdenum or tungsten plate 34 which is provided inside a dashed circle as shown in FIG. 3A. In the case of a GTO, each set of the semiconductor layers that are formed under the individual cathode electrodes 32 is operated in parallel as a GTO to control a large current. The entire cathode electrode is thus uniformly pressed to prevent unbalanced currents among cathode elements due to the local press contact or contact resistance differences and also prevent unbalanced currents due to fluctuations of the turn-off characteristics resulting from lack of uniformity of the stress in the silicon. FIG. 3B is a sectional view taken along line B-B' in FIG. 3A.

In the pressure-applied type semiconductor devices described, the stress distribution over the semiconductor body is basically equivalent to that in a case where a semi-infinite plate is pressed by a rigid body. On the basis of this assumption, experiments were conducted, in which a semi-infinite elastic member 36 was pressed with a cylindrical rigid post 38 as shown in FIG. 4A. The stress P(Z) provided in the semi-infinite elastic body 36 in the direction normal to the press contact surface is analyzed according to a program which is prepared for the purpose of analyzing stress in complex structures, commonly called SAP (Structural Analysis Program). The result is as shown in FIG. 4B. (The SAP was developed in 1969 by Prof. E. L. Wilson and others at the University of Southern California, and rearranged forms of this prototype program have been used in various areas in the world.) As is apparent from FIG. 4B, the stress distribution over the surface of contact between the semi-infinite elastic body 36 and rigid body 38 is such that the stress is theoretically infinite at the edge of the rigid body so that the stress distribution in the semi-infinite elastic body 36 is extremely lacking in uniformity.

From this fact, it is thought that if a semiconductor body (i.e., a semi-infinite disc) is pressed with a metal plate and a copper stamp, the stress distribution in the semiconductor body is as shown in FIG. 4B. In general, with the prior art pressure-applied type semiconductor device, the stress concentration at the edge of the semiconductor body is inevitable. In fact, when a GTO device which was ruptured during use is disassembled, a ring-like trace of press contact as shown by the dashed circle in FIG. 3A can be observed. In the GTO device where such a trace of press contact is observed, the maximum anode current (i.e., maximum controllable anode current $I_{TGQ}$) during use is greatly reduced. From the experimental fact that lack of uniformity of the stress distribution causes lack of uniformity of anode current in the press contact surface, resulting in fluctuations of the turn-off time, it may be concluded that the extreme reduction of the maximum anode current results from an overcurrent density state of the edge where the turn-off time is extended due to high pressure. Further, the GTO device where a trace of press contact can be observed is prone to fatal characteristic deteriorations such as a short-circuit between the cathode and gate electrodes along the edge of the cathode electrode caused by thermal fatigue during operation. However, there has been no appropriate method of solving the above problems.

It has been a common practice to grind a metal plate 42 in contact with a semiconductor body 40 to form an inclined surface 44 as shown in FIG. 5. This is done for the purpose of removing burrs from the metal plate 42 on the side thereof in contact with the body. It seems that the inclined surface can alleviate the stress at the edge. However, the grinding angle $\theta$ is usually $\theta \geq 30°$, and the thickness of the ground portion is usually 100 to 300 $\mu$m with a metal plate 42 having a thickness of 500 to 1,000 $\mu$m. The height of the cathode region in the semiconductor body, on the other hand, is 10 to 30 $\mu$m. Therefore, the length of the ground portion is far greater than the height of the cathode region. This means that the removal of burrs reduces a post diameter, that is, changes the outermost point of the contact surface from point P to point Q as shown in FIG. 5.

In this case, the same result of analysis of stress distribution as that shown in FIG. 4B could be obtained using the SAP as mentioned above. In this case, for the same load applied, the stress at the edge is found to be increased by an amount corresponding to the reduction of the area of the metal plate in contact with the semiconductor body 40. That is, the formation of the inclined surface 44 makes various conditions for the semiconductor body inferior.

As has been shown, with the prior art pressure-applied type semiconductor device, the stress distribution in the semiconductor body always lacks uniformity, giving rise to non-uniform electrical characteristics. These non-uniform electrical characteristics sometimes lead to the rupture of the semiconductor body.

SUMMARY OF THE INVENTION

An object of the invention is to provide a pressure-applied type semiconductor element, which has improved reliability.

Another object of the invention is to provide a pressure-applied type semiconductor device, which has improved electrical characteristics.

A further object of the invention is to provide a pressure-applied type semiconductor device, in which local stress concentration in a semiconductor body can be alleviated.

A still further object of the invention is to provide a pressure-applied type semiconductor device, with which the possibility of rupture of the semiconductor body can be reduced.

The above objects can be attained by a pressure-applied type semiconductor device, which comprises a semiconductor body, a first metal plate provided on one side of the semiconductor body and having a coefficient of thermal expansion close to the coefficient of thermal expansion of the body, a first metal stamp for urging the semiconductor body via the metal plate and having at least one peripheral groove, a second metal plate provided on the other side of the semiconductor body and having a coefficient of thermal expansion close to the coefficient of thermal expansion of the body, and a second metal stamp for urging the semiconductor body via the second metal plate.

According to the invention, use is made of the fact that the peripheral groove formed in the first metal stamp urging the semiconductor body undergoes deformation due to the pressure applied. This has an effect of alleviating the stress concentration in the semiconductor body right beneath the edge of the first metal stamp.

Thus, according to the invention, it is possible to effectively reduce local stress concentration in the semiconductor body urged by the metal stamp. Thus, the electrical characteristics of the pressure-applied semiconductor device can be made more stable and the reliability can be improved.

BRIEF DESCRIPTION OF THE DRAWINGS

By way of example and to make the description clearer, reference is made to the accompanying drawings, in which:

FIG. 8 is a view showing the relation between the compressive stress in the semiconductor body immediately under the edge of a thermal compensation plate and a groove formed in the thermal compensation plate.

DETAILED DESCRIPTION OF THE PREFERRED EMBODIMENTS

Figure 1:
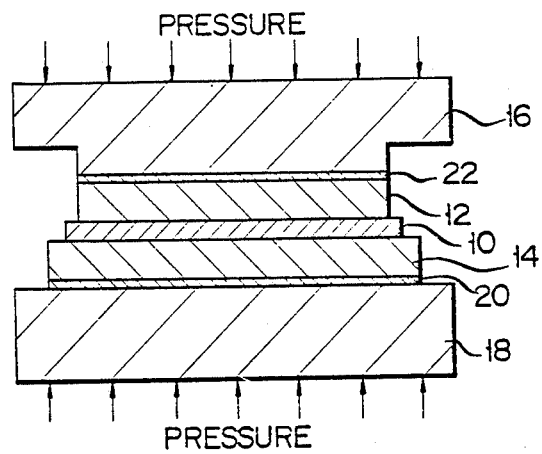
FIG. 1 is a schematic sectional view showing a prior art pressure-applied type semiconductor device.
Figure 2A:
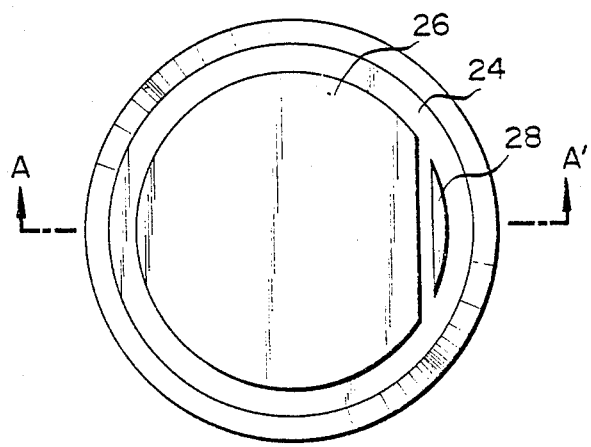
FIG. 2A is a schematic plan view showing a prior art power semiconductor body.
Figure 2B:
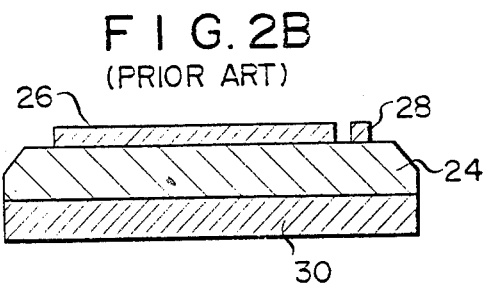
FIG. 2B is a sectional view taken along line A-A' in FIG. 2A.
Figure 3A:
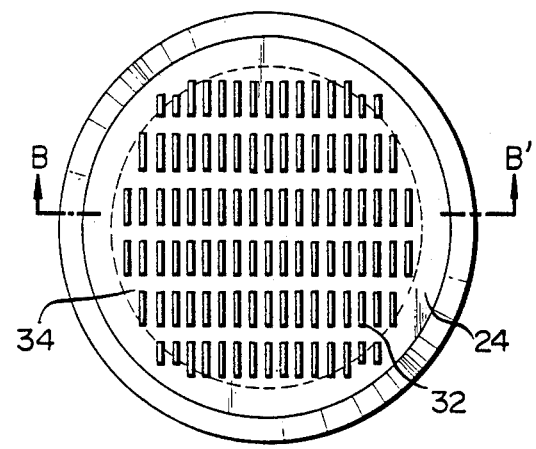
FIG. 3A is a schematic plan view showing a different prior art power semiconductor body.
Figure 3B:
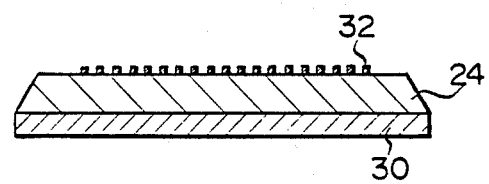
FIG. 3B is a sectional view taken along line B-B' in FIG. 3A.
Figure 4A:
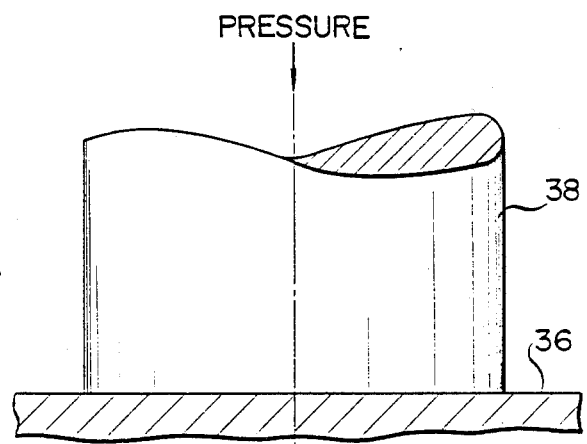
FIGS. 4A and 4B illustrate a stress distribution in the semiconductor body.
Figure 4B:
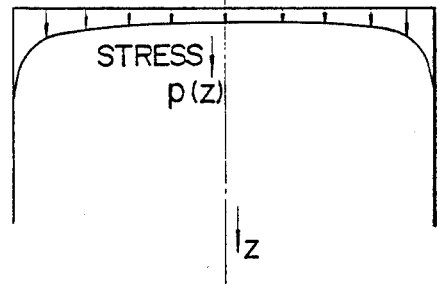
Figure 5:
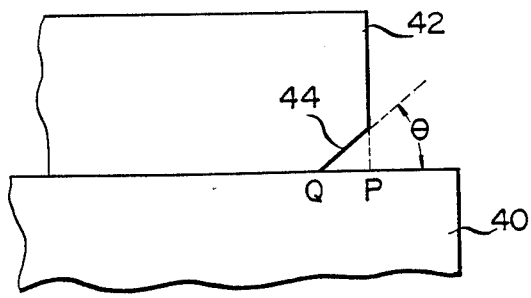
FIG. 5 is a view for explaining the removal of burrs from the edge surface of a metal plate in contact with the semiconductor body.
Figure 6:
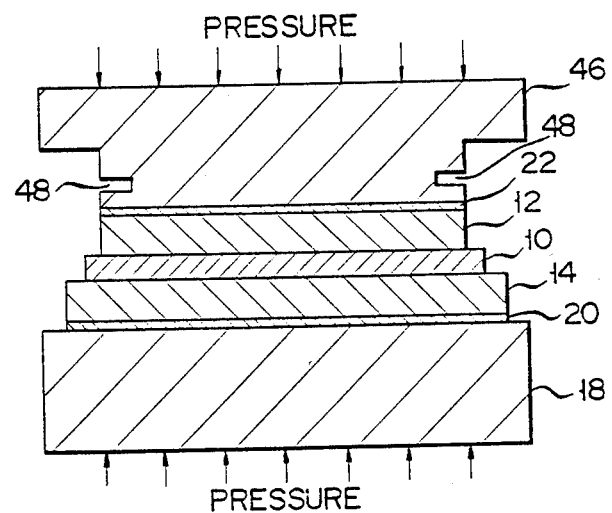
FIG. 6 is a schematic sectional view showing a first embodiment of the pressure-applied type semiconductor device according to the invention.
Figure 7:
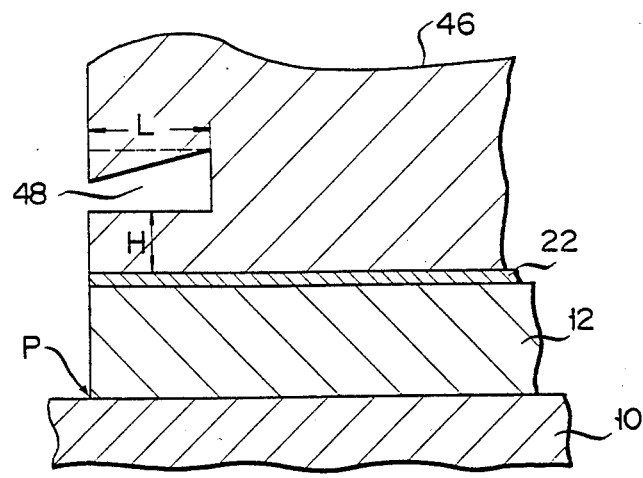
FIG. 7 is an enlarged-scale fragmentary sectional view for illustrating the deformation of a groove shown in FIG. 6.
Figure 9:
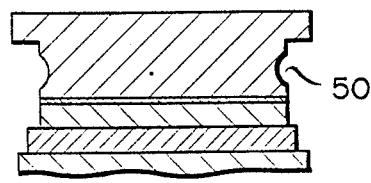
FIGS. 9 to 12 are schematic sectional views showing second and third embodiments of the invention.
Figure 10:
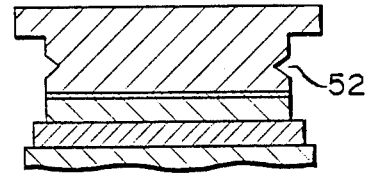
Figure 11:
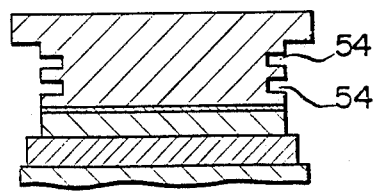
Figure 12:
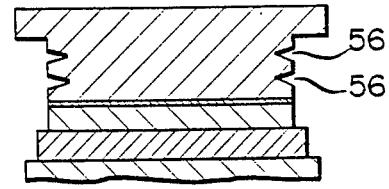

FIG. 6 shows a first embodiment of the invention. Like parts to those in FIG. 1 are designated by like reference numerals, and their descriptions will not be given. A semiconductor body 10 comprises a GTO or the like having a multiple-point cathode electrode. A metal stamp 46 is provided on one side of the multiple-point cathode electrode of the semiconductor body 10 via a thermal compensation plate 12. The metal stamp 46 has an annular peripheral groove 48. With this construction of the device, by applying a compressive load in the direction of the arrows to press the semiconductor body 10, the groove 48 is deformed as shown in FIG. 7 according to the result of analysis using the SAP. If the magnitude of the load g is adjusted by setting the average pressure P ($\neq$q/S) obtained from the area S of contact between the semiconductor body 10 and thermal compensation plate 12 to approximately 200 to 400 kg/cm$^2$, the deformation of the groove 48 is within the elastic limit so that it can be restored to the initial shape by removing the load.

FIG. 8 shows the relation of the compressive stress in the semiconductor body 10 right under the edge (point P) of the thermal compensation plate 12 to the depth L and height H of the groove 48. The data shown is obtained as a result of analysis carried out by applying a total load of 5,000 kg to the metal stamp 46. In this case, the semiconductor body 10 was made of silicon, the thermal compensation plate 12 was a molybdenum plate having a thickness of 0.5 mm, the metal stamp 46 was a copper post having a radius of 25 mm, and the thermal compensation plate 14 was tungsten.

As is seen from FIG. 8 the effect of alleviating the stress concentration at the edge can be greatly increased by increasing the depth of the groove 48. Thus, this method is excellent as a method of removing the stress concentration which would cause variations in the electrical characteristics of the device and would ultimately cause rupture of the device. It was also confirmed by experiments conducted by the inventors that the provision of a peripheral groove in the metal stamp positively contributes to the alleviation of the stress concentration. In practice, restrictions are imposed upon the depth of the groove by the difficulty of forming a thin deep annular groove, increase of thermal resistance and various other factors. Experiments reveal that a stress of approximately 600 kg/cm$^2$ does not lead to any undesired electrical influence. According to FIG. 8, if the depth of the groove is set to approximately 1.5 mm, the stress that is produced is below the afore-mentioned permissible level. With such a groove, the increase of the thermal resistance is only about 5%. This sacrifice is very slight in view of the advantage of preventing the stress concentration. As for the level of the groove 48, effects according to the invention can be obtained so long as it is not spaced too far apart from the thermal compensation plate 12.

FIGS. 9 to 12 show different embodiments of the invention. In these embodiments, the metal stamp is formed with different grooves. In the second embodiment of FIG. 9, a groove 50, which has a large width or height dimension and has an arcuate sectional profile, is formed. In the third embodiment of FIG. 10, a groove 52 having a V-shaped sectional profile is formed. In the fourth embodiment of FIG. 11, two grooves 54 having rectangular sectional profiles are formed. In the fifth embodiment of FIG. 12, two grooves 56 having V-shaped sectional profiles are formed.

Further, where a doughnut-shaped metal stamp is used, similar effects may also be obtained by forming an annular peripheral groove.

Further, various other changes and modifications can be made without departing from the scope of the invention.

What we claim is:

1. A pressure-applied type semiconductor device comprising:
   a semiconductor body;
   a first metal plate provided on one side of said semiconductor body and having a peripheral surface and a coefficient of thermal expansion similar to the coefficient of thermal expansion of said body; coefficient of thermal expansion of said body;
   a first metal stamp for urging said semiconductor body via said first metal plate and having at least one groove formed in its peripheral surface and extending in the circumferential direction thereof, said groove having a bottom inwardly positioned from the peripheral surface of said first metal plate;
   a second metal plate provided on the other side of said semiconductor body and having a coefficient of thermal expansion similar to the coefficient of thermal expansion of said body; and
   a second metal stamp for urging said semiconductor body via said second metal plate.

2. A pressure-applied type semiconductor device according to claim 1, wherein each said peripheral annular groove has a rectangular sectional profile.

3. A pressure-applied type semiconductor device according to claim 1, wherein each said peripheral annular groove has an arcuate sectional profile.

4. A pressure-applied type semiconductor device according to claim 1, wherein each said peripheral annular groove has a V-shaped sectional profile.

5. A pressure-applied type semiconductor device according to claim 1, wherein said semiconductor body includes a gate turn-off thyristor having a plurality of cathode electrodes, said first metal stamp being provided on the cathode electrode side of said semiconductor body.

6. A pressure-applied type semiconductor device according to claim 1, wherein said first and second metal stamps are cylindrical in form.

* * * * *